United States Patent [19]
Liu et al.

[11] Patent Number: 6,023,122
[45] Date of Patent: Feb. 8, 2000

[54] SURFACE WAVE DEVICES WITH TAPERED TRANSDUCERS

[75] Inventors: Wen Liu, Nepean; Thomas P. Cameron, Stittsville; Steve A. Beaudin, Ottawa, all of Canada

[73] Assignee: Nortel Networks Corporation, Montreal, Canada

[21] Appl. No.: 09/292,377

[22] Filed: Apr. 15, 1999

[51] Int. Cl.[7] .................................................. H03H 9/72
[52] U.S. Cl. ............................................................ 310/313 B
[58] Field of Search .............................. 310/313 R, 313 B

[56] References Cited

U.S. PATENT DOCUMENTS

| | | | |
|---|---|---|---|
| 4,203,082 | 5/1980 | Tsukamoto et al. | 333/194 |
| 4,635,400 | 1/1987 | Solie | 333/195 |
| 4,746,882 | 5/1988 | Solie | 333/196 |
| 4,785,270 | 11/1988 | Kinsman | 333/193 |
| 4,878,036 | 10/1989 | Yatsuda et al. | 333/195 |
| 4,908,542 | 3/1990 | Solie | 310/313 B |
| 5,831,492 | 11/1998 | Solie | 333/193 |
| 5,831,494 | 11/1998 | Solie | 333/193 |

FOREIGN PATENT DOCUMENTS

| | | | |
|---|---|---|---|
| 26 56 154 | 7/1977 | Germany | 310/313 B |
| 6-90132 | 3/1994 | Japan | 310/313 B |
| 6-188674 | 7/1994 | Japan | 310/313 B |
| 2002363 | 10/1993 | Russian Federation | 310/313 R |

OTHER PUBLICATIONS

"SAW Based Systems for Communications Satellites", R.C. Peach, IEEE Ultrasonics Symposium, 1995, pp. 159–166.

"SAW Filters and Resonators for Public Communication Systems", Y. Yamamoto, IEEE Ultrasonics Symposium, 1993, pp. 95–103.

*Primary Examiner*—Thomas M. Dougherty
*Attorney, Agent, or Firm*—R. John Haley

[57] ABSTRACT

A SAW device has tapered trasnsducers each of which is divided into two or more tapered transducer parts, which are arranged in line with one another in one or more SAW tracks with the tapers of adjacent tapered transducer parts complementary to one another to provide a compact arrangement. The tapered transducer parts can be symmetrically or asymmetrically tapered to provide different frequency bands for band or bandwidth switching of the SAW device. Input and output impedances of the SAW device can be maintained during such switching by switching of dummy transducer parts also provided on the same piezoelectric substrate.

21 Claims, 4 Drawing Sheets

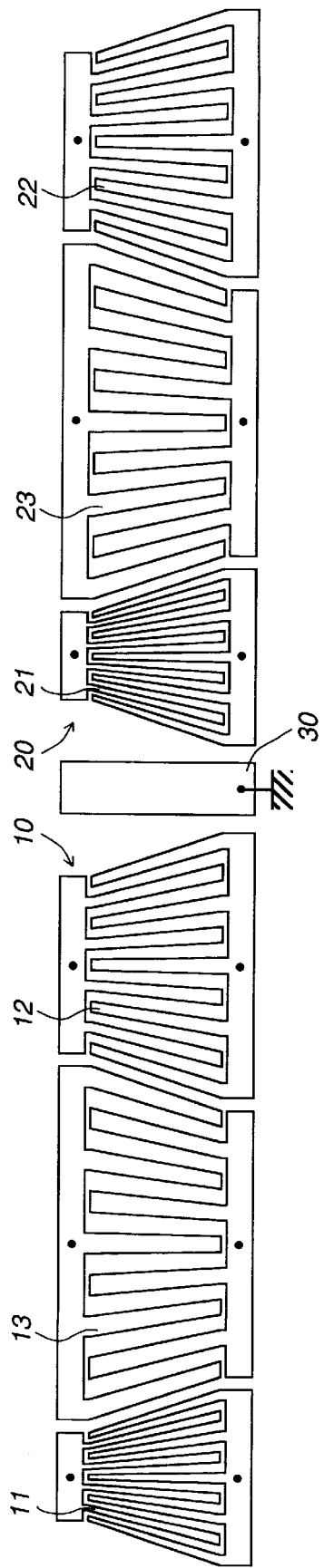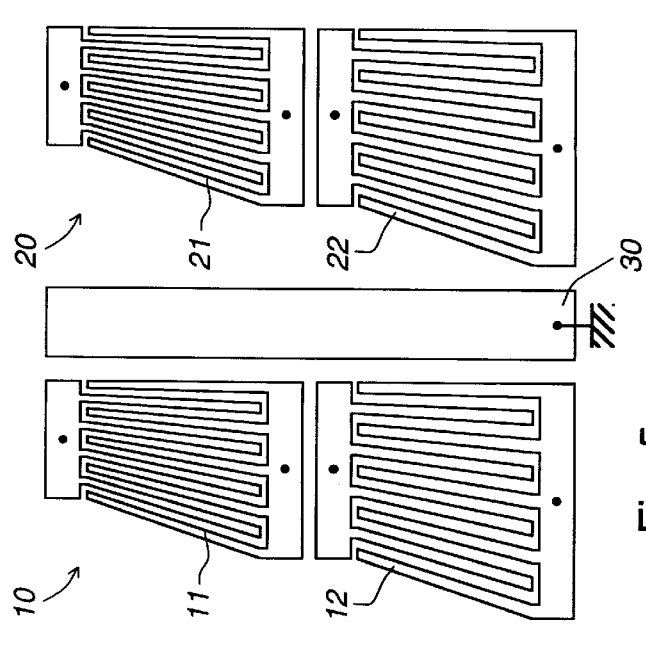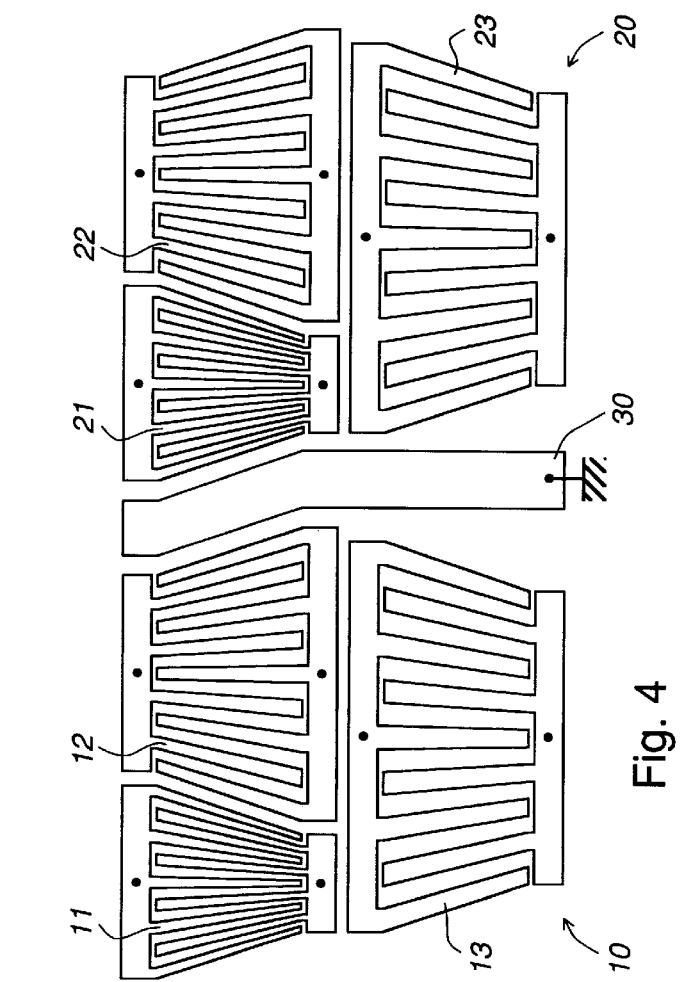

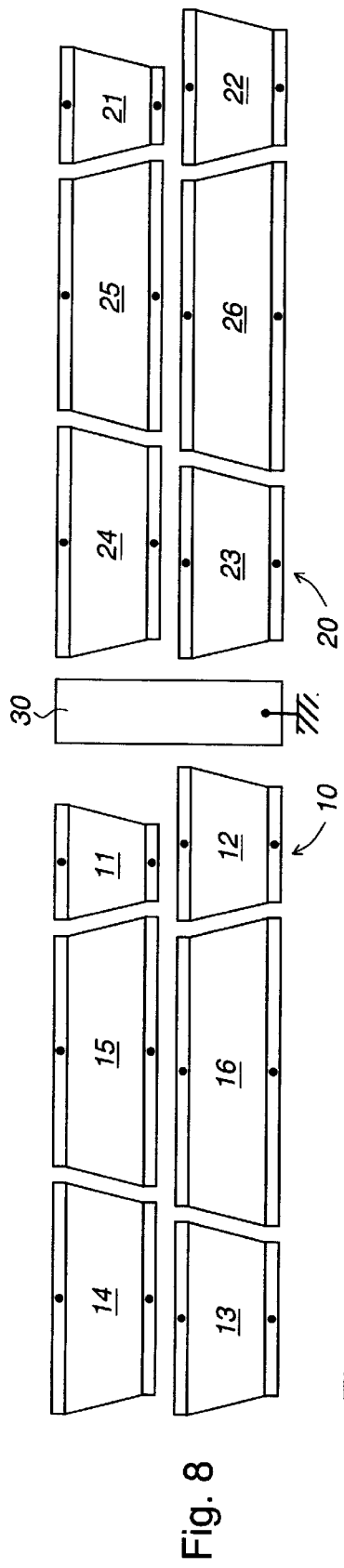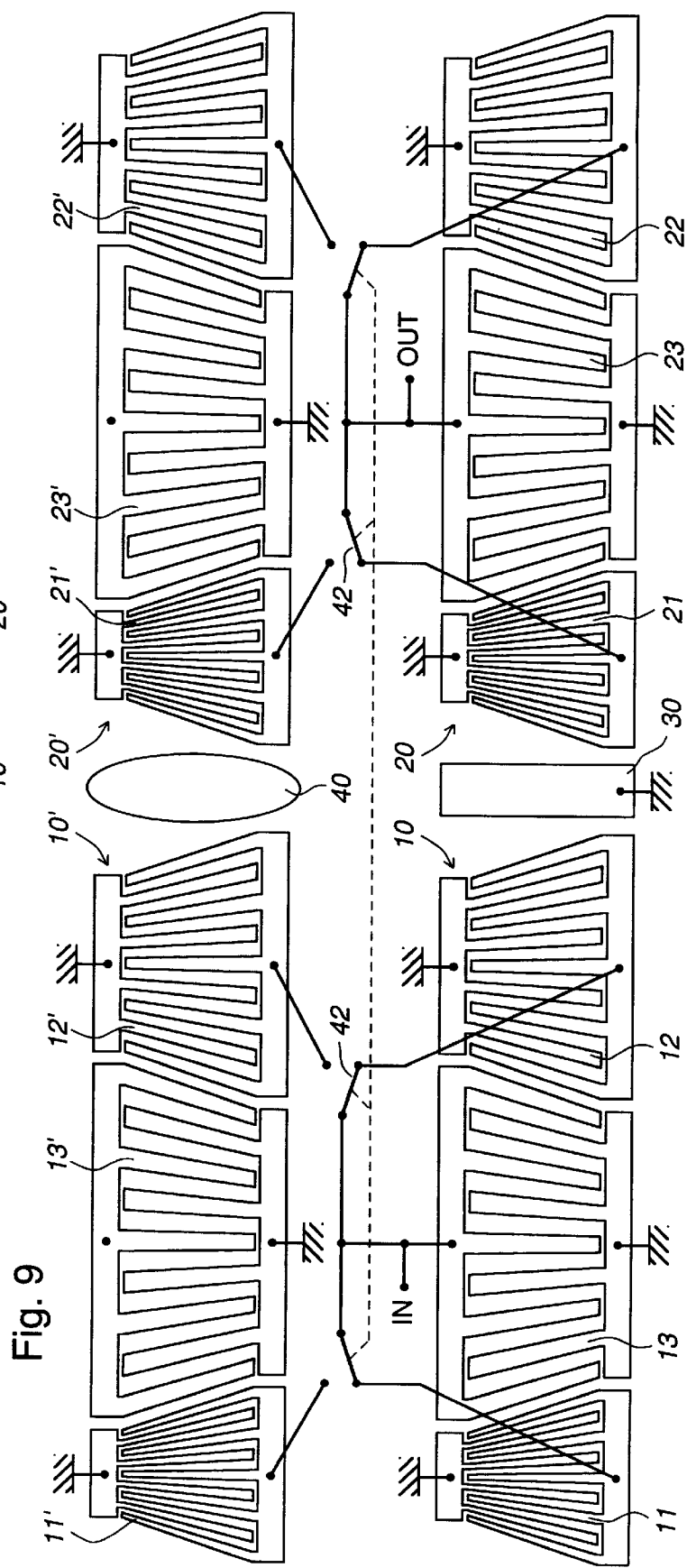
Fig. 8
Fig. 9

SURFACE WAVE DEVICES WITH TAPERED TRANSDUCERS

This invention relates to surface wave devices with tapered transducers. The term "surface wave" is used herein to embrace surface acoustic waves (SAWs), including leaky SAWs, surface skimming bulk waves, and similar acoustic waves, and is abbreviated to SAW below.

BACKGROUND OF THE INVENTION

It is known to provide a SAW device with tapered interdigital transducers (IDTs) in order to provide a changing SAW wavelength, and hence a changing center frequency for SAW propagation, across the aperture of the SAW device, thereby to provide the SAW device with a relatively broad fractional bandwidth. The taper may be linear, hyperbolic, or in accordance with some other function, and tapers can be applied to IDTs of different types, for example to bidirectional IDTs and to SPUDTs (single phase unidirectional trandsucers) with and without known weighting techniques such as withdrawal weighting, finger position or width weighting, etc.

Tapered IDTs and SAW devices using them have also been referred to as having slanted finger geometries, but the term "slanted" is not used further herein to avoid potential confusion with other and different types of SAW device, such as slanted array correlators (SACs).

For example, SAW devices using tapered IDTs in various configurations are known from U.S. Pat. No. 4,635,008 issued Jan. 6, 1987 and entitled "Dispersive SAW Filter With Tapered Transducers", U.S. Pat. No. 4,746,882 issued May 24, 1988 and entitled "SAW Multiplexer Using Tapered Transducers", U.S. Pat. No. 4,908,542 issued Mar. 13, 1990 and entitled "SAW Tapered Transducers", and U.S. Pat. No. 5,831,492 issued Nov. 3, 1998 and entitled "Weighted Tapered SPUDT SAW Device", all in the name of Leland P. Solie.

It is also known in satellite communications systems to use SAW device modules providing a switched or programmable bandwidth. For example, "SAW Based Systems for Communications Satellites" by R. C. Peach, 1995 IEEE Ultrasonics Symposium, pages 159–166 describes a programmable SAW filter module with four SAW filters having different bandwidths which are switched singly or in groups to provide a desired bandwidth, and "SAW Filters and Resonators for Public Communications Systems" by Y. Yamamoto, 1993 Ultrasonics Symposium, pages 95–103 describes SAW transversal filters having pass bands adjacent one another for different channels to provide for changing filter bandwidth digitally. In order to provide the desired bandwidths with necessary accuracy, for example to provide amplitude cross-overs at −6 dB with continuous phase responses for adjacent channel filters as described in the latter article, such filters are complex and expensive.

With increasing use of SAW devices for example in mobile cellular wireless communications systems, and increasing bandwidth choices providable in such systems for example for communications of data and/or telephone signals, it is desirable to provide SAW devices which can facilitate providing switchable or selectable filter bandwidths in a manner that can preserve advantages of SAW devices such as low cost, ease of manufacture, and small size.

SUMMARY OF THE INVENTION

According to one aspect of this invention there is provided a surface wave device having at least one tapered transducer on a surface of a piezoelectric substrate, wherein the tapered transducer is divided into a plurality of tapered transducer parts each for transducing surface waves in a respective band of frequencies, at least two of the tapered transducer parts being arranged adjacent and in line with one another in a direction of surface acoustic wave (SAW) propagation with at least one of the tapered transducer parts being inverted relative to another of the tapered transducer parts in line therewith so that tapers at adjacent edges of the tapered transducer parts are substantially complementary to one another.

The tapered transducer can be divided into at least three tapered transducer parts arranged adjacent and in line with one another and/or arranged for transducing SAWs in at least two parallel paths. The surface wave device preferably has another tapered transducer on the surface of the piezoelectric substrate similarly divided into a like plurality of tapered transducer parts arranged in a similar manner to the parts of said at least one transducer, for propagation of SAWs in respective bands of frequencies between corresponding transducer parts of the transducers.

The surface wave device can include switching means for selectively switching a signal between individual ones and/or groups of the tapered transducer parts.

Another aspect of the invention provides a surface wave device comprising a first interdigital transducer (IDT) and a second IDT on a surface of a piezoelectric substrate for coupling surface acoustic waves (SAWs) therebetween, wherein the first IDT comprises: a first tapered transducer part for transducing SAWs in a first frequency band; and a second tapered transducer part for transducing SAWs in a second frequency band; the first and second transducer parts being arranged in line with one another with their tapers substantially complementary to one another.

The second IDT can also comprise first and second tapered transducer parts for transducing SAWs in the first and second frequency bands respectively, the first and second transducer parts of the second IDT being arranged in line with one another with their tapers substantially complementary to one another, with equal center-to-center distances of the first and second tapered transducer parts of the second IDT from the first and second tapered transducer parts, respectively, of the first IET.

Each of the tapered transducer parts can be asymmetrically tapered, the first and second tapered transducer parts of each of the first and second IDTs being adjacent one another at edges thereof which are at a smaller angle to a direction of SAW propagation than non-adjacent edges thereof.

The first IDT can further comprise a third tapered transducer part, for transducing SAWs in a third frequency band, arranged in line with the first and second tapered transducer parts adjacent to the second tapered transducer part and having its taper substantially complementary to that of the second tapered transducer part. In this case the second IDT preferably also comprises first, second, and third tapered transducer parts for transducing SAWs in the first, second, and third frequency bands respectively, the first, second, and third transducer parts of the second IDT being arranged in line with one another with the second tapered transducer part between the first and third tapered transducer parts and with its taper substantially complementary to tapers of the first and third tapered transducer parts, with equal center-to-center distances of the first, second, and third tapered transducer parts of the second IDT from the first, second, and third tapered transducer parts, respectively, of the first IDT.

Alternatively the first IDT can further comprise a third tapered transducer part, for transducing SAWs in a third frequency band, arranged laterally from the first and second tapered transducer parts, and can further comprise a fourth tapered transducer part, for transducing SAWs in a fourth frequency band, arranged in line with the third transducer part with its taper substantially complementary to that of the third transducer part.

Typically the first, second, and third frequency bands can be substantially adjacent to one another to facilitate band or bandwidth switching of the surface wave device, and the surface wave device also can include switching means for selectively switching a signal between individual ones and/or groups of the tapered transducer parts. The surface wave device can further comprise a dummy IDT substantially the same as the first IDT and coupled to the switching means for maintaining a substantially constant impedance presented by the surface wave device with switching of said signal.

The invention also provides a method of maintaining a substantially constant impedance presented by a SAW device with switching of a signal between individual ones and/or groups of tapered interdigital transducers of the SAW device having different frequency bands, comprising the step of switching the signal between active ones of said tapered interdigital transducers and dummy ones of said tapered interdigital transducers provided on the same piezoelectric substrate.

BRIEF DESCRIPTION OF THE DRAWINGS

The invention will be further understood from the following description with reference to the accompanying drawings. The drawings are illustrative, diagrammatic, and not to scale, each figure illustrates the transducers of the respective SAW device but not other parts of the SAW device, such as a piezoelectric substrate on which the transducers are provided and other parts of the SAW devices such as reflectors and external connections which may be provided in known manner. The same references are used in different figures to denote corresponding parts. In the drawings:

FIG. 3 represents a SAW device in accordance with a first embodiment of this invention;

FIG. 4 represents a SAW device in accordance with a second embodiment of the invention;

FIG. 5 represents a tapered SAW device with each transducer divided into two segments for different frequency bands;

FIG. 8 represents a SAW device in accordance with a fourth embodiment of the invention; and FIG. 9 represents a SAW device in accordance with a further embodiment of the invention.

DETAILED DESCRIPTION

Figure 1:
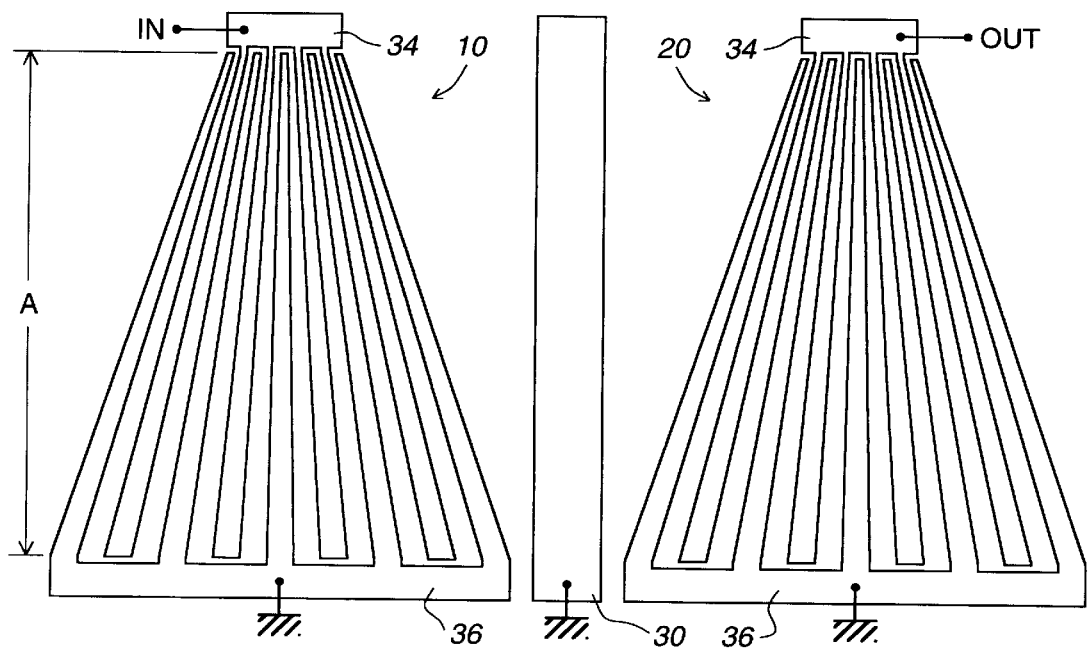
FIG. 1 represents a known tapered SAW device.

Referring to the drawings, FIG. 1 represents a known SAW device having tapered interdigital transducers (IDTs) 10 and 20 on a piezoelectric substrate represented by the plane of the drawing. The IDTs 10 and 20 are coupled in line with one another for propagation of surface acoustic waves (SAWs) therebetween via an isolating electrode 32 which for example is a wide grounded conductive layer formed simultaneously with formation of conductors of the IDTs. The electrode 32 is optional and may be omitted. Each of the IDTs 10 and 20 comprises interdigital fingers extending from conductive rails 34, 36 at opposite sides of the IDT, one of which rails is grounded and the other of which provides an input connection IN or an output connection OUT, the connections being interchangeable as is known. Between the rails 34 and 36, over an aperture A of the IDTs, the periodicity of the fingers (the widths of the fingers and of the gaps between the fingers) changes, linearly as shown, to provide different SAW center frequencies at different points over the aperture, thereby providing a relatively broad pass band of the SAW device as a whole. The IDTs 10 and 20 are arranged symmetrically relative to the electrode 32, and have a center-to-center distance between the IDTs which is the same for all frequencies across the aperture A so that the SAWs at different frequencies or wavelengths all have the same delay through the SAW device from its input to its output.

Although as shown in FIG. 1 the taper is linear, it may alternatively be hyperbolic or in accordance with some other function. Although the IDTs 10 and 20 are shown as being bidirectional DTs with only a few fingers and without weighting, they may alternatively be of any other type with or without weighting, and typically may comprise large numbers of fingers. Although the IDTs 10 and 20 are represented as being the same on each side of the electrode 32, they can be different, for example the input and output IDTs may have different numbers of fingers. The same comments apply to all of the other arrangements described below, and it should be understood that these and other variations known in the art of SAW devices may be applied individually and in various combinations to the various embodiments of the invention as described below.

Figure 2:
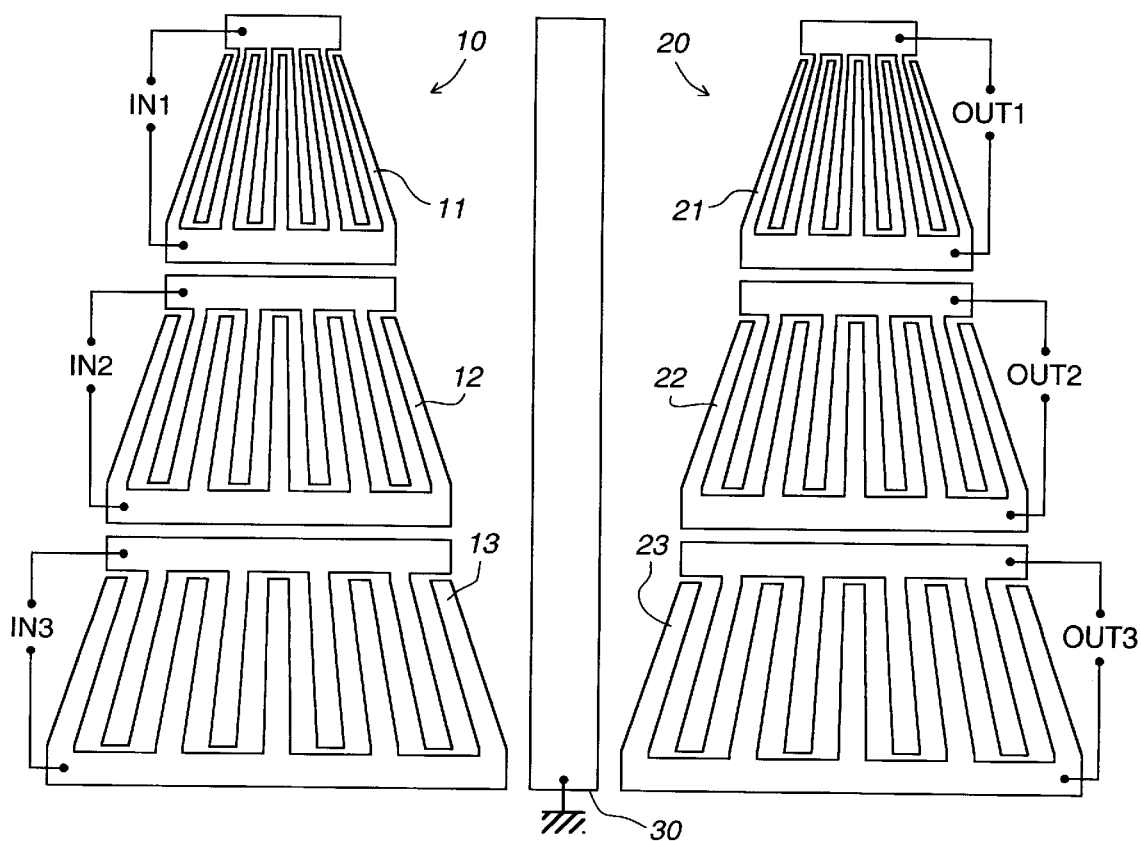
FIG. 2 represents a tapered SAW device with each transducer divided into three segments for different frequency bands.

Referring to FIG. 2, the IDT 10 is divided into three parts 11, 12, and 13 each having one third the aperture A of the IDT 10 of FIG. 1 between respective conductive rails and providing three input connections IN1, IN2, and IN3. Similarly, the IDT 20 is divided into three parts 21, 22, and 23 each having one third the aperture A of the IDT 20 of FIG. 1 between respective conductive rails providing respective three output connections OUT1, OUT2, and OUT3. It can be appreciated that the input IDT parts 11, 12, and 13 can be connected in series with one another, and the output IDT parts 21, 22, and 23 can be connected in series with one another, to provide a SAW device which is substantially the same as that of FIG. 1. Alternatively, one or more of the IDT parts 11 and 21, 12 and 22, and 13 and 23 can be used individually or collectively to provide SAW propagation between the respective inputs and outputs within respective frequency bands f1, f2, and f3 each of which is one third of and which collectively correspond to an overall frequency band f of the SAW device of FIG. 1.

The center-to-center distances between the input and output IDT parts 11 and 21, 12 and 22, and 13 and 23 are the same to provide a constant delay for the different SAW paths through the SAW device. In consequence, the SAW device of FIG. 2, like that of FIG. 1, requires a relatively large area of the piezoelectric substrate. In embodiments of the invention described below, this required area is reduced by a rearrangement of the IDT parts, and in particular so that at least two parts of each IDT are arranged in line with one another with their tapers being arranged complementary to one another (i.e. with at least one of the parts being inverted from its orientation as shown in FIG. 2).

Referring to FIG. 3, all three parts 11, 12, and 13 of the input IDT 10, and all three parts 21, 22, and 23 of the output IDT 20, are arranged in line with one another on opposite sides of the grounded isolator 30. From left to right as shown in FIG. 3, the input IDT 10 comprises the part 11, the part 13 inverted relative to its orientation as shown in FIG. 2 so that its taper is complementary to that of the closely adjacent parts 11 and 12, and the part 12 closest to the isolator 30. Also from left to right as shown in FIG. 3, the output IDT 20 comprises the part 21 closest to the isolator 30, the part 23 inverted relative to its orientation as shown in FIG. 2 so that its taper is complementary to that of the closely adjacent parts 21 and 22, and the part 22 furthest from the isolator 30. Consequently, the center-to-center distances between the input and output IDT parts 11 and 21, 12 and 22, and 13 and 23 are again all the same to provide a constant delay for the different SAW paths through the SAW device, although this delay is greater than that of the device of FIG. 2. SAWs in the frequency bands f1, f2, and f3 are propagated from the input IDT parts 11, 12, and 13 respectively to the output IDT parts 21, 22, and 23 respectively in a manner similar to the different frequencies of SAW propagation that take place in a chirped SAW device known in the art.

As a result of the more compact arrangement of the IDT parts and the reduced size of the isolator 30, the SAW device of FIG. 3 requires substantially less, e.g. about 30% to 50% less, substrate area than the SAW device of FIG. 2.

For simplicity and clarity in FIG. 3, and in FIGS. 4 to 8 described below, input and output connections to the IDT parts are represented simply by connection dots on the respective conductive rails of the IDT parts. A signal or ground connection is made to each of these conductive rails to provide the desired inputs and outputs for the respective frequency bands of the SAW device in the same manner as illustrated in FIG. 2.

FIG. 4 represents an alternative SAW device, in which the input IDT parts 11 and 12 and the output IDT parts 21 and 22 are arranged in line with one another in one SAW track, and the input IDT part 13 and the output IDT part 23 are arranged in line with one another in an adjacent SAW track, the IDT parts 11 and 21 being inverted relative to their orientations in FIG. 2 to provide tapers complementary to that of the adjacent IDT parts 12 and 22, and the IDT parts 13 and 23 also being inverted relative to their orientations in FIG. 2. Again, the center-to-center distances between the input and output IDT parts 11 and 21, 12 and 22, and 13 and 23 are all the same to provide a constant delay for the different SAW paths through the SAW device, the isolator 30 in this case being inclined between the IDT parts 12 and 21 to match the tapers thereof, thereby reducing the substrate area required and also reducing the SAW delay to little more than that of the SAW device of FIG. 2.

In FIG. 5, each of the IDTs 10 and 20 is divided into only two parts 11, 12 and 21, 22 respectively, for propagation of SAWs within two adjacent frequency bands f1 and f2. In this case the IDT parts 11, 12 and 21, 22 are asymmetric, each having a left edge (as illustrated) that is tapered and a right edge (as illustrated) that is perpendicular to the direction of SAW propagation. For each point over the apertures of the IDT parts, the center-to-center distance from the input IDT part to the output IDT part is constant, so that there is a constant delay for SAW propagation from the inputs to the outputs for all frequencies within the bandwidth of the SAW device. As in the cases described above, the input IDT parts 11 and 12 and the output IDT parts 21 and 22 can be connected in series with one another, to provide a SAW device having the total bandwidth f1+f2, or one or both of the IDT parts 11 and 21, 12 and 22 can be used individually or collectively to provide SAW propagation between the respective inputs and outputs within the respective frequency bands f1 and f2.

Figure 6:
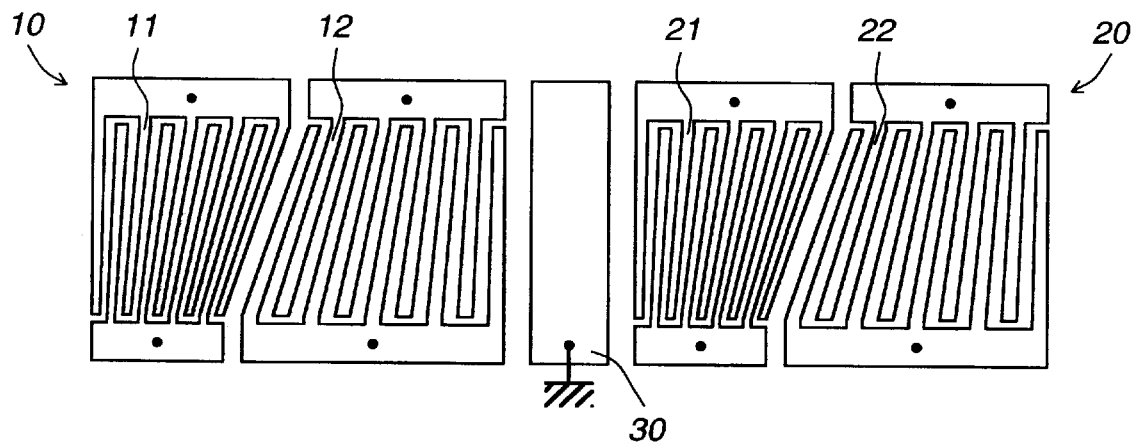
FIG. 6 represents a SAW device in accordance with a third embodiment of the invention.

Referring to FIG. 6, the two parts 11, 12 of the input IDT 10 of FIG. 5, and the two parts 21, 22 of the output IDT 20, are arranged in line with one another on opposite sides of the grounded isolator 30. From left to right as shown in FIG. 6, the input IDT 10 comprises the part 11, inverted relative to its orientation as shown in FIG. 5 so that its taper is complementary to that of the closely adjacent part 12, and the part 12 closest to the isolator 30. Also from left to right as shown in FIG. 6, the output IDT 20 comprises the part 21 closest to the isolator 30, inverted relative to its orientation as shown in FIG. 5 so that its taper is complementary to that of the closely adjacent part 22, and the part 22 furthest from the isolator 30. Consequently, the center-to-center distances between the input and output IDT parts 11, 21 and 12, 22 are the same to provide a constant delay for the different SAW paths through the SAW device, this delay being greater than that of the device of FIG. 5. SAWs in the frequency bands f1 and f2 are propagated from the input IDT parts 11 and 12 respectively to the output IDT parts 21 and 22 respectively in a manner similar to the different frequencies of SAW propagation that take place in a chirped SAW device known in the art. Again, as a result of the more compact arrangement of the IDT parts and the reduced size of the isolator 30, the SAW device of FIG. 6 requires substantially less substrate area than the SAW device of FIG. 5.

Considered generally, it can be appreciated that in FIG. 6 each of the IDTs 10 and 20 has its asymmetric transducer parts 11, 12 and 21, 22 arranged in line with and adjacent to one another so that the edges of the transducer parts that are adjacent one another are at a smaller angle to the direction of SAW propagation than the non-adjacent edges of these transducer parts. For example, as illustrated in FIG. 6 the non-adjacent edges of the transducer parts 11 and 12 are normal (i.e. at an angle of 90°) to the direction of SAW propagation, whereas the adjacent adges of the transducer parts 11 and 12 are at a smaller angle (about 72° as illustrated) to the direction of SAW propagation, to provide the most compact arrangement of the transducer parts.

Figure 7:
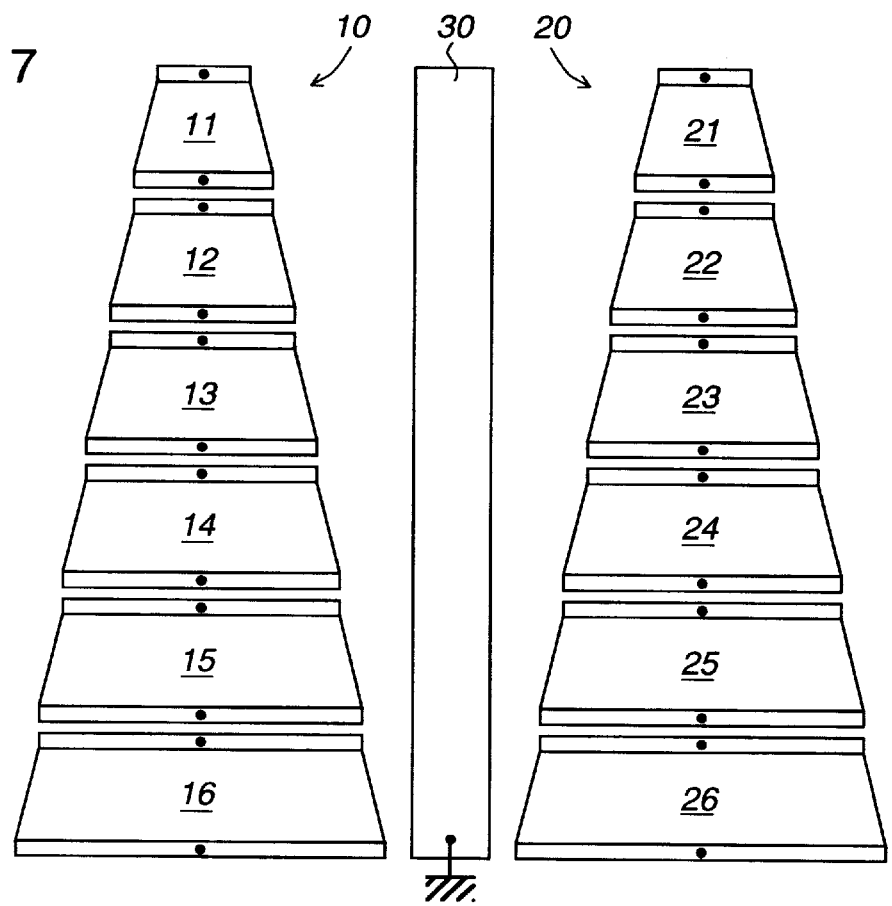
FIG. 7 represents a tapered SAW device with each transducer divided into a larger number of segments for different frequency bands.

FIG. 7 illustrates a SAW device which is similar to that of FIG. 2 except that the input IDT 10 and the output IDT 20 are divided into a larger number of parts, in this case six parts 11 to 16 and 21 to 26 respectively, for respective adjacent frequency bands f1 to f6. As in the SAW device of FIG. 2, the center-to-center distances of the corresponding parts 11, 21 to 16, 26 of the SAW device of FIG. 7 are the same, so that there is a constant SAW delay for different SAW frequencies, and the SAW device requires a substantial area of the piezoelectric substrate.

FIG. 8 illustrates a more compact arrangement of the IDT parts 11 to 16 and 21 to 26 with a correspondingly reduced size of the isolator 30, requiring substantially less substrate area than the SAW device of FIG. 7. In FIG. 8, the input IDT parts 14, 15, and 11 and the output IDT parts 24, 25, and 21 are arranged in line with one another in one SAW track, and the input IDT parts 13, 16, and 12 and the output IDT parts 23, 26, and 22 are arranged in line with one another in an adjacent SAW track. The IDT parts 11 to 14 and 21 to 24 are inverted relative to their orientations in FIG. 7 to provide complementary tapers at the edges of the respective adjacent IDT parts. The IDT parts in the two SAW tracks are selected so that their total lengths are similar, and the IDT parts are arranged so that the center-to-center distances of the input and output IDT parts 11, 21 to 16, 26 are all the same to provide a constant SAW delay for all of the frequencies f1 to f6.

It can be appreciated that the invention is also applicable to the division of tapered IDTs into other numbers of parts and corresponding frequency bands, with other arrangements of the IDT parts in one, two, or more than two SAW tracks. The input and output IDT parts can be switched in various ways, individually and collectively in groups, to provide various pass bands that may be desired.

A potential disadvantage of such switching can arise in relation to matching of the SAW device to input and output circuits to which it is coupled in use. For example, a change of the pass band of a SAW device due to such switching can result in the SAW device presenting different input and output impedances to the input and output circuits to which it is coupled, so that matching impedances may also require switching. This potential disadvantage can be avoided by an arrangement of a type as described below by way of example with reference to FIG. 9.

Referring to FIG. 9, a SAW device represented therein includes an input IDT 10 and an output IDT 20, with an optional isolator 30 between them, arranged in parts 11 to 13 and 21 to 23 respectively in the same manner as in FIG. 3, with one conductive rail of each IDT part being grounded as shown in FIG. 9. The SAW device further comprises a dummy input IDT 10' and a dummy output IDT 20', also arranged in parts 11' to 13' and 21' to 23' respectively. The dummy IDTs 10' and 20' are identical to the IDTs 10 and 20 respectively, except that they have between them an acoustic absorber 40 which prevents propagation of SAWs between these dummy IDTs. FIG. 9 also illustrates ganged switches 42 which serve to couple signals from an input IN to the SAW device and to couple signals from the SAW device to an output OUT. As illustrated in FIG. 9 and described below, the switches 42 serve to switch the pass band of the SAW device between the wide band f of all of the input IDT parts 11 to 13 and all of the output IDT parts 21 to 23 collectively, in a lower position of the switches 42 as shown, and a narrower band f3 of the input IDT part 13 and the output IDT part 23 in an upper position of the switches 42.

In the lower position of the switches 42 as shown, the input IDT parts 11, 12, and 13 are connected in parallel with one another to receive a signal supplied to the input IN, and the output IDT parts 21, 22, and 23 are also connected in parallel with one another to supply a signal from the SAW device to the output OUT. In this position of the switches 42 the dummy IDTs 10' and 11' are not coupled to the input IN or the output OUT, and have no effect. In the upper position of the switches 42, a signal at the input IN is supplied to the input IDT part 13 and to the dummy input IDT parts 11' and 12', and a signal passed by the SAW device is supplied from the output IDT part 23 to the output OUT, to which the dummy output IDT parts 21' and 21' are also connected. No SAW is propagated from the dummy input IDT parts 11' and 12' to the dummy output IDT parts 22' and 23', because any such SAW is absorbed by the acoustic absorber 40, but the connection of the dummy input IDT parts 11' and 12' to the input IN and of the dummy output IDT parts 21' and 22' to the output OUT ensures that the impedances presented by the SAW device at its input and output are unchanged on of the switching of the switches 42, so that such pass band switching does not require switching of matching impedances.

Although FIG. 9 and the above description relate to only one example of a pass band switching operation, it can be appreciated that the same principles can be applied for arbitrary arrangements of pass band switching of the parts of the input and output IDTs 10 and 20, using various arrangements of switches and one or more such dummy IDTs 10' and 20'. It can also be appreciated that the switching principles described above with reference to FIG. 9 can also be applied to SAW devices having IDT arrangements such as those of FIGS. 2, 5, and 7. It is also observed that the switches 42, which are illustrated schematically in FIG. 9, can be implemented in any form suitable for switching the respective signals, including analog and digital integrated circuit switches which may be controlled in any desired manner.

In addition, it can be appreciated that the invention is also applicable to SAW devices in which each IDT has other than a linear taper as described above and illustrated in the drawings; for example the taper may be hyperbolic or in accordance with some other function and may be different for the input and output IDTs. Furthermore, the invention can be applied to IDTs of other types than those described above and illustrated in the drawings, for example to bidirectional IDTs and to SPUDTs (single phase unidirectional trandsucers) with or without weighting. Although as described above both of the input and output IDTs 10 and 20 are tapered, this need not necessarily be the case and the invention is also applicable to surface wave devices in which only one of the the input and output IDTs is tapered, the other for example being a relatively wide band IDT and/or being coupled via a multistrip coupler which can be provided in place of the isolator 30. Further, although as described above the transducer parts of each transducer all have substantially the same aperture, this need not necessarily be the case and instead different transducer parts may have different apertures.

Thus although particular embodiments and examples of the invention have been described above, it can be appreciated that these and numerous other modifications, variations, and adaptations may be made without departing from the scope of the invention as defined in the claims.

What is claimed is:

1. A surface wave device having at least one tapered transducer on a surface of a piezoelectric substrate, wherein the tapered transducer is divided into a plurality of tapered transducer parts each for transducing surface waves in a respective band of frequencies, at least two of the tapered transducer parts being arranged adjacent and in line with one another in a direction of surface acoustic wave (SAW) propagation with at least one of the tapered transducer parts being inverted relative to another of the tapered transducer parts in line therewith so that tapers at adjacent edges of the tapered transducer parts are substantially complementary to one another.

2. A surface wave device as claimed in claim 1 and having another tapered transducer on the surface of the piezoelectric substrate and similarly divided into a like plurality of tapered transducer parts arranged in a similar manner to the parts of said at least one transducer, for propagation of SAWs in respective bands of frequencies between corresponding transducer parts of the transducers.

3. A surface wave device as claimed in claim 1 wherein the tapered transducer is divided into at least three tapered transducer parts arranged adjacent and in line with one another.

4. A surface wave device as claimed in claim 3 and having another tapered transducer on the surface of the piezoelectric substrate and similarly divided into a like plurality of tapered transducer parts arranged in a similar manner to the parts of said at least one transducer, for propagation of SAWs in respective bands of frequencies between corresponding transducer parts of the transducers.

5. A surface wave device as claimed in claim 1 wherein the tapered transducer is divided into at least three tapered transducer parts arranged for transducing SAWs in at least two parallel paths.

6. A surface wave device as claimed in claim 5 and having another tapered transducer on the surface of the piezoelectric substrate and similarly divided into a like plurality of tapered transducer parts arranged in a similar manner to the parts of said at least one transducer, for propagation of SAWs in respective bands of frequencies between corresponding transducer parts of the transducers.

7. A surface wave device as claimed in claim 1 and including switching means for selectively switching a signal between individual ones and/or groups of the tapered transducer parts.

8. A surface wave device comprising a first interdigital transducer (IDT) and a second IDT on a surface of a piezoelectric substrate for coupling surface acoustic waves (SAWs) therebetween, wherein the first IDT comprises:

a first tapered transducer part for transducing SAWs in a first frequency band; and a second tapered transducer part for transducing SAWs in a second frequency band;

the first and second transducer parts being arranged in line with one another with their tapers substantially complementary to one another.

9. A surface wave device as claimed in claim 8 wherein the second IDT also comprises first and second tapered transducer parts for transducing SAWs in the first and second frequency bands respectively, the first and second transducer parts of the second IDT being arranged in line with one another with their tapers substantially complementary to one another, with equal center-to-center distances of the first and second tapered transducer parts of the second IDT from the first and second tapered transducer parts, respectively, of the first IDT.

10. A surface wave device as claimed in claim 9 wherein each of the tapered transducer parts is asymmetrically tapered, the first and second tapered transducer parts of each of the first and second IDTs being adjacent one another at edges thereof which are at a smaller angle to a direction of SAW propagation than non-adjacent edges thereof.

11. A surface wave device as claimed in claim 8 wherein each of the tapered transducer parts is asymmetrically tapered, the first and second tapered transducer parts of the first and second IDTs being adjacent one another at edges thereof which are at a smaller angle to a direction of SAW propagation than non-adjacent edges thereof.

12. A surface wave device as claimed in claim 8 wherein the first IDT further comprises a third tapered transducer part, for transducing SAWs in a third frequency band, arranged in line with the first and second tapered transducer parts adjacent to the second tapered transducer part and having its taper substantially complementary to that of the second tapered transducer part.

13. A surface wave device as claimed in claim 12 wherein the second IDT also comprises first, second, and third tapered transducer parts for transducing SAWs in the first, second, and third frequency bands respectively, the first, second, and third transducer parts of the second IDT being arranged in line with one another with the second tapered transducer part between the first and third tapered transducer parts and with its taper substantially complementary to tapers of the first and third tapered transducer parts, with equal center-to-center distances of the first, second, and third tapered transducer parts of the second IDT from the first, second, and third tapered transducer parts, respectively, of the first IDT.

14. A surface wave device as claimed in claim 8 wherein the first IDT further comprises a third tapered transducer part, for transducing SAWs in a third frequency band, arranged laterally from the first and second tapered transducer parts.

15. A surface wave device as claimed in claim 14 wherein the first IDT further comprises a fourth tapered transducer part, for transducing SAWs in a fourth frequency band, arranged in line with the third transducer part with its taper substantially complementary to that of the third transducer part.

16. A surface wave device as claimed in claim 14 wherein the first, second, and third frequency bands are substantially adjacent to one another.

17. A surface wave device as claimed in claim 8 wherein the first and second frequency bands are substantially adjacent to one another.

18. A surface wave device as claimed in claim 12 wherein the first, second, and third frequency bands are substantially adjacent to one another.

19. A surface wave device as claimed in claim 18 and including switching means for selectively switching a signal between individual ones and/or groups of the tapered transducer parts.

20. A surface wave device as claimed in claim 19 and further comprising a dummy IDT substantially the same as the first IDT and coupled to the switching means for maintaining a substantially constant impedance presented by the surface wave device with switching of said signal.

21. A method of maintaining a substantially constant impedance presented by a SAW device with switching of a signal between individual ones and/or groups of tapered interdigital transducers of the SAW device having different frequency bands, comprising the step of switching the signal between active ones of said tapered interdigital transducers and dummy ones of said tapered interdigital transducers provided on the same piezoelectric substrate.

* * * * *